(12) United States Patent
Ishizaki (10) Patent No.: US 8,218,327 B2
(45) Date of Patent: Jul. 10, 2012

(54) ELECTRONIC DEVICE, ELECTRONIC COMPONENT, AND METHOD OF MANUFACTURING ELECTRONIC DEVICE

(75) Inventor: Kiyokazu Ishizaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 416 days.

(21) Appl. No.: 12/536,394

(22) Filed: Aug. 5, 2009

(65) Prior Publication Data

US 2010/0165590 A1 Jul. 1, 2010

(30) Foreign Application Priority Data

Nov. 28, 2008 (JP) ................................ 2008-305182

(51) Int. Cl.
*H05K 7/00* (2006.01)
(52) U.S. Cl. ........ 361/760; 361/807; 361/825; 361/827; 439/620.06
(58) Field of Classification Search .............. 439/541.5, 439/620.06, 620.12, 620.15, 620.22, 620.25, 439/632, 65, 72, 950; 361/760, 807, 825, 361/827
See application file for complete search history.

(56) References Cited

U.S. PATENT DOCUMENTS

| | | | | |
|---|---|---|---|---|
| 3,639,893 | A * | 2/1972 | Kunkle et al. | 439/633 |
| 6,170,088 | B1 * | 1/2001 | Tate | 2/209.13 |
| 6,288,903 | B1 * | 9/2001 | Oguchi et al. | 361/753 |
| 6,293,823 | B1 * | 9/2001 | Kasuga | 439/573 |
| 7,120,972 | B2 * | 10/2006 | O'Banion | 24/303 |
| 7,331,793 | B2 * | 2/2008 | Hernandez et al. | 439/38 |
| 2003/0043554 | A1 * | 3/2003 | Seymour | 361/760 |
| 2004/0200080 | A1 * | 10/2004 | Lauri | 30/541 |
| 2008/0068816 | A1 * | 3/2008 | Han et al. | 361/760 |

FOREIGN PATENT DOCUMENTS

| | | |
|---|---|---|
| JP | 04-343494 | 11/1992 |
| JP | 05-069883 U | 9/1993 |
| JP | 09-181433 | 7/1997 |
| JP | 10-051128 A | 2/1998 |
| JP | 2002-057433 | 2/2002 |

OTHER PUBLICATIONS

Notice of Rejection mailed by Japan Patent Office on Dec. 15, 2009 in the corresponding Japanese patent application No. 2008-305182.
Notice of Rejection mailed by Japan Patent Office on Mar. 9, 2010 in the corresponding Japanese patent application No. 2008-305182.

* cited by examiner

*Primary Examiner* — Hoa C Nguyen
(74) *Attorney, Agent, or Firm* — Knobbe Martens Olson & Bear LLP (57) ABSTRACT

According to one embodiment, an electronic device includes an electronic component and a circuit board. The electronic component includes a metal material. The circuit board includes a first surface on which the electronic component is mounted and a second surface opposite the first surface. The electronic component includes a contact surface configured to be in contact with the first surface, and is configured to have the center of gravity at a location displaced from the center of the contact surface. The electronic component is temporarily fixed by a magnetic force that attracts the metal material from the second surface with the contact surface being in contact with the first surface.

6 Claims, 7 Drawing Sheets

-- Prior Art --

FIG.5

-- Prior Art --

TEMPORARILY FIX CONNECTOR WITH MAGNET

FIG.8B

FIX CONNECTOR WITH SCREW

FIG.8C

REMOVE MAGNET

FIG.11

ELECTRONIC DEVICE, ELECTRONIC COMPONENT, AND METHOD OF MANUFACTURING ELECTRONIC DEVICE

CROSS-REFERENCE TO RELATED APPLICATIONS

This application is based upon and claims the benefit of priority from Japanese Patent Application No. 2008-305182, filed Nov. 28, 2008, the entire contents of which are incorporated herein by reference.

BACKGROUND

1. Field

One embodiment of the invention relates to an electronic device, an electronic component, and a method of manufacturing the electronic device.

2. Description of the Related Art

In recent years, with the downsizing of electronic devices, surface-mountable electronic components that are mountable on a circuit board are becoming increasingly smaller and lighter.

Such a smaller and lighter electronic component is less stable than a commonly-used electronic component and is difficult to be fixed when mounted on a circuit board. For example, Japanese Patent Application Publication (KOKAI) No. H4-343494 discloses a conventional technology in which, when a chip is mounted on a circuit board, the chip is temporarily fixed with a magnet to prevent the tombstone phenomenon.

There are electronic components of various types and shapes to be mounted on a circuit board. Examples of the electronic components include a connector to connect to another circuit board or electronic component. Although recent connectors are provided with a physical interface for cable connection, they are downsized in such a manner that the surface thereof that faces a circuit board when they are mounted thereon (hereinafter, "contact surface") becomes smaller. As a result, the center of gravity is displaced from the center of the contact surface, and the connectors are unstable when placed on the circuit board until fixed thereto.

With the conventional technology described above, a chip may not be able to be temporarily fixed with the magnet depending on the component or material of the chip. In other words, not all chips can be temporarily fixed with the magnet. More specifically, if a chip contains little material attracted by the magnet, it is difficult to prevent the tombstone phenomenon with the magnet.

That is, according to the conventional technology, various types of electronic components cannot be temporarily fixed on a circuit board by only using the magnet. In addition, while the conventional technology is aimed at a chip that is stable when simply placed on a circuit board, it does not take into account an electronic component the center of gravity of which is displaced from the center of the contact surface. Therefore, for example, if an electronic component, the center of gravity of which is displaced from the center of the contact surface, is attracted by the magnet, the electronic component, on the contrary, may become unstable when placed on a circuit board depending on the part attracted by the magnet.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic, device comprises an electronic component and a circuit board. The electronic component comprises a metal material. The circuit board includes a first surface on which the electronic component is mounted and a second surface opposite the first surface. The electronic component comprises a contact surface configured to be in contact with the first surface, and is configured to have the center of gravity at a location displaced from the center of the contact surface. The electronic component is configured to be temporarily fixed by a magnetic force that attracts the metal material from the second surface with the contact surface being in contact with the first surface.

According to another embodiment of the invention, an electronic component comprises a contact surface configured to be in contact with a first surface of a circuit board, and has the center of gravity at a location displaced from the center of the contact surface. The electronic component further comprises a metal material configured to be embedded at a position that allows the electronic component to be temporarily fixed by a magnetic force from a second surface of the circuit board opposite the first surface with the contact surface being in contact with the first surface.

According to still another embodiment of the invention, there is provided a method of manufacturing an electronic device in which an electronic component is fixed to a first surface of a circuit board. The method comprises: placing, on the first surface, the electronic component comprising a contact surface configured to be in contact with the first surface and having a center of gravity at a location displaced from the center of the contact surface, a metal material being embedded in the electronic component; temporarily fixing the electronic component by a magnetic force that attracts the metal material from a second surface of the circuit board opposite the first surface with the contact surface being in contact with the first surface; and fixing the electronic component on the circuit board with a fixing element while the electronic component is being temporarily fixed to the circuit board.

Figure 1:
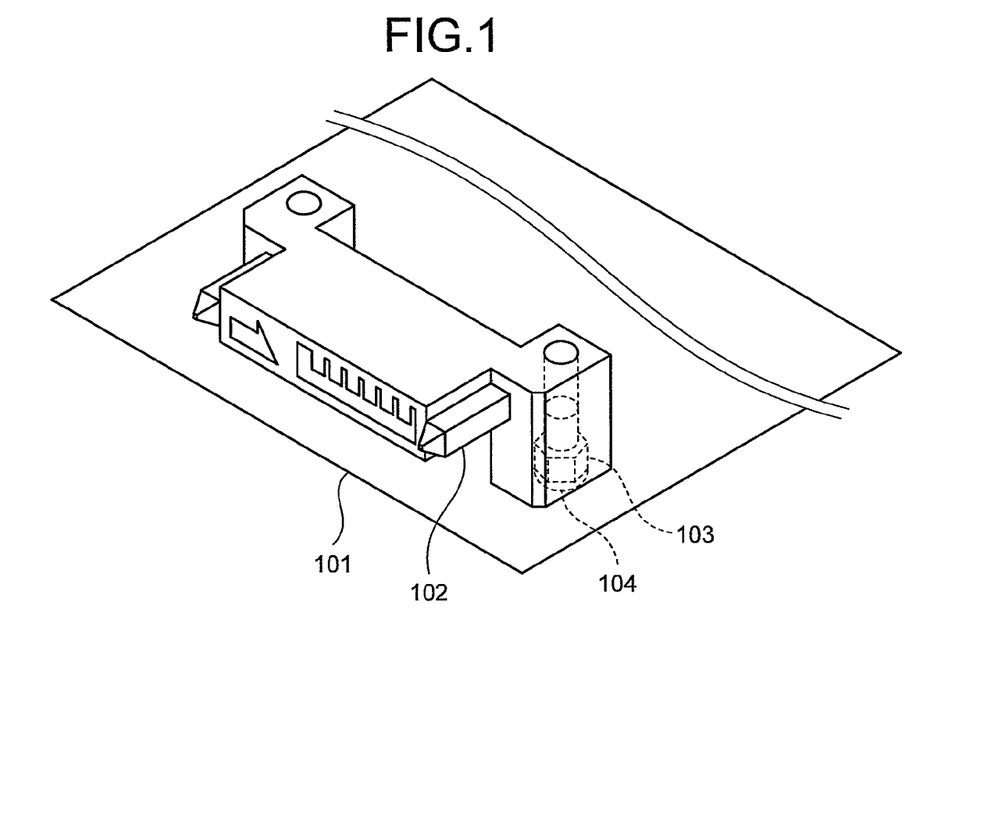
FIG. 1 is an exemplary schematic diagram of a hardware configuration of an electronic device according to an embodiment of the invention.

FIG. 1 is a schematic diagram illustrating a hardware configuration of an electronic device 100 according to an embodiment of the invention. As illustrated in FIG. 1, the electronic device 100 comprises a circuit board 101, a connector 102, and a screw 104, which are built in the electronic device 100. Although various other electronic components are mounted on the circuit board 101, they will not be described herein for the purpose of simplicity.

The circuit board 101 comprises at least one surface (hereinafter, "mounting surface") configured to have an electronic component surface-mounted thereon. A wiring or circuit pattern or the like is printed on the mounting surface. The circuit board 101 may be made of, for example, a glass epoxy material. The circuit board 101 may be made of any other material. While the thickness of the circuit board 101 is not particularly limited, the circuit board 101 is assumed to have a thickness that allows a magnet to temporarily fix the connector 102 in which is embedded a metal material from the opposite side of the circuit board 101.

Figure 2:
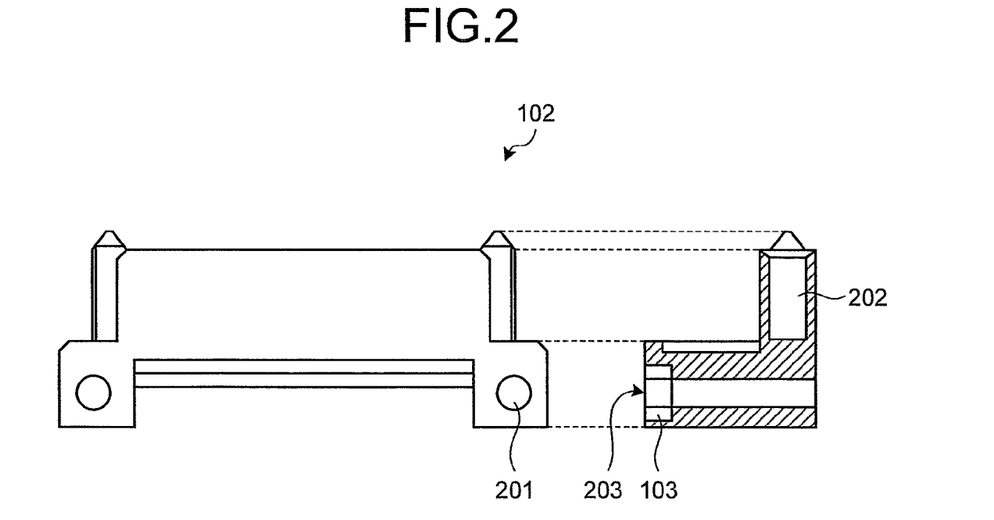
FIG. 2 is an exemplary projection view of the shape of a connector in the embodiment.

The connector 102 is one of electronic components mounted on the circuit board 101. FIG. 2 is a projection view of the shape of the connector 102. As illustrated in FIG. 2, the connector 102 comprises a contact surface 203 that is in contact with the mounting surface when mounted on the circuit board 101. The connector 102 further comprises a cable connection mechanism 202 for connecting/disconnecting a cable. The cable connection mechanism 202 extends in a direction parallel to the contact surface 203. A nut 103 is embedded in the connector 102. Further, the connector 102 is provided with a screw hole 201 into which a screw is screwed.

Figure 3:
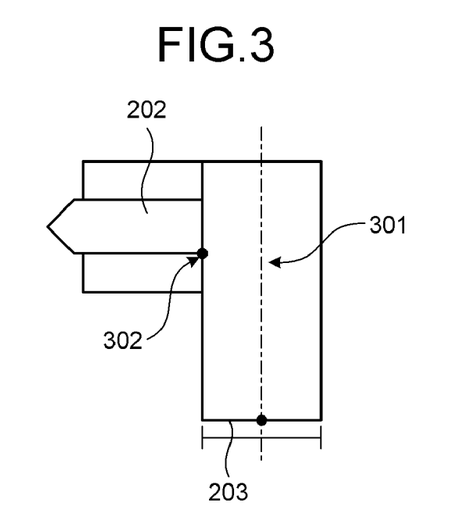
FIG. 3 is an exemplary schematic diagram for explaining a relationship between the contact surface and the center of gravity of the connector in the embodiment.

FIG. 3 is a schematic diagram for explaining a relationship between the contact surface 203 and the center of gravity of the connector 102. As illustrated in FIG. 3, because of the cable connection mechanism 202, a gravity center 302 of the connector 102 is displaced from a center line 301 of the contact surface 203 to the side of the cable connection mechanism 202. As just described, since the gravity center 302 is displaced from the center line 301 of the contact surface 203, the connector 102 is unstable when mounted on the circuit board 101. Therefore, it is difficult to maintain the contact surface 203 of the connector 102 in contact with the mounting surface of the circuit board 101.

Figure 4:
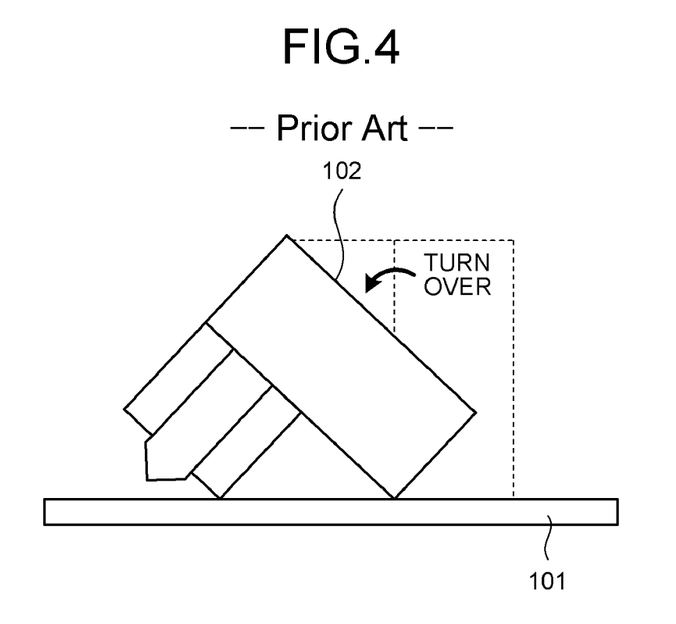
FIG. 4 is an exemplary schematic diagram for explaining the case where an electronic component having difficulty to standalone is inclined when placed on a circuit board in the embodiment.

More specifically, as illustrated in FIG. 4, when only subjected to some force, the connector 102 turns over or inclines on the circuit board 101. This suggests that some measures need to be taken to temporarily fix the connector 102 on the circuit board 101 until the connector 102 is finally fixed thereto.

Figure 5:
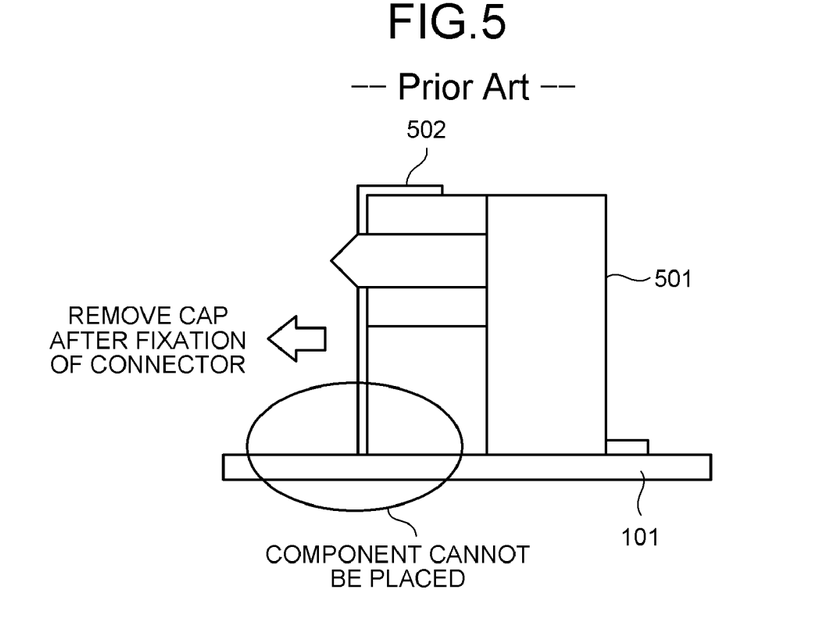
FIG. 5 is an exemplary schematic diagram for explaining the case where a connector placed on the circuit board is prevented from being inclined through the use of a conventional inclination prevention cap in the embodiment.

FIG. 5 is a schematic diagram for explaining a conventional technology for temporarily fixing a connector 501 on the circuit board 101. As illustrated in FIG. 5, to stably position (temporarily fix) the connector 501 on the circuit board 101, an inclination prevention cap 502 is attached in advance to the connector 501. In this manner, according to the conventional technology, the connector 501 is prevented from inclining when mounted on the circuit board 101 with an auxiliary component for holding an electronic component such as the inclination prevention cap 502. Alternatively, a jig hole is formed in a printed wiring board, and a jig is inserted through the jig hole from the back of the printed wiring board to hold an electronic component. When the inclination prevention cap 502 is employed, it is removed after the connector 501 is fixed to the circuit board 101. As just described above, the inclination prevention cap 502 can prevent the connector 501 from inclining on the circuit board 101 until the connector 501 is fixed to the circuit board 101.

The inclination prevention cap 502, however, necessitates the step of removing it, which complicates the process of fixing the connector 501 to the circuit board 101. Besides, because of the inclination prevention cap 502, an electronic component cannot be placed below the cable connection mechanism 202 of the connector 501. In addition, it is necessary to secure an area on the circuit board 101 to remove the inclination prevention cap 502. This limits the mounting of an electronic component on the circuit board 101, and thus high-density design cannot be achieved. Meanwhile, when a jig is passed through the jig hole to hold an electronic component, a through hole has to be formed in the circuit board 101. This reduces an electronic component mounting area and a wiring pattern area on the circuit board 101.

There is another conventional technology for preventing an electronic component mounted on a printed wiring board from rising or lifting up. With this conventional technology, weight is applied onto an electronic component with a weight, an arm, or the like to prevent the electronic component from rising. The conventional technology, however, requires the extra work of attaching a weight, an arm, or the like to apply weight onto an electronic component.

Figure 6:
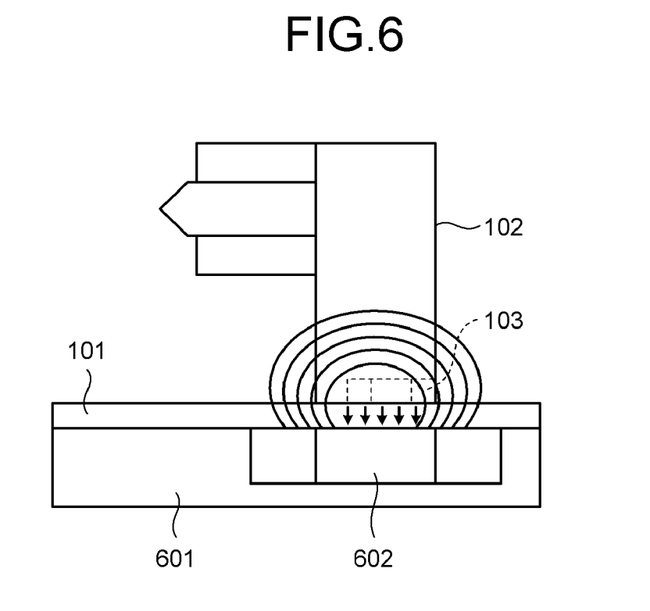
FIG. 6 is an exemplary schematic diagram for explaining the case where the connector is temporarily fixed to the circuit board by attracting a nut embedded in the connector with a magnet in the embodiment.

On the other hand, according to the embodiment, the nut 103 is embedded in the connector 102 at a position in contact with the contact surface 203 to thereby temporarily fix the connector 102 to the circuit board 101. FIG. 6 is a schematic diagram for explaining the case where the connector 102 is temporarily fixed to the circuit board 101 by using a magnet 602. As illustrated in FIG. 6, when the circuit board 101 is placed on a reflow palette 601, the magnet 602 attracts, with its magnetic force, the nut 103 embedded in the connector 102 mounted on the mounting surface of the circuit board 101 from the lower surface of the circuit board 101, i.e., the surface of the circuit board 101 opposite the mounting surface. Thus, the connector 102 can be temporarily fixed to the circuit board 101.

In the connector 102 of the embodiment, the nut 103 is embedded in a position on the opposite side of the cable connection mechanism 202 with respect to the center line 301 of the contact surface 203. This prevents the displacement of the gravity center 302 due to the cable connection mechanism 202, and thereby the connector 102 can be temporarily fixed more stably. The nut 103 is described above as being embedded in a position in contact with the contact surface 203 on the opposite side of the cable connection mechanism 202 with respect to the center line 301 of the contact surface 203. However, this is by way of example and not of limitation. The nut 103 may be embedded in any position if the connector 102 can be temporarily fixed to the circuit board 101 with the contact surface 203 being in contact with the mounting surface of the circuit board 101.

Further, while, in the embodiment, the nut 103 is embedded in the connector 102 to attract the connector 102 by the magnetic force of the magnet 602, the metal material embedded in the connector 102 is not limited to the nut 103. In addition to the nut 103, any other material (attracted by a magnet) in any shape may be employed in consideration of the shape (including the contact surface) of an electronic component in which the material is to be embedded, the method of fixing the electronic component on the circuit board, and the like.

Referring back to FIG. 1, the screw 104 fixes the connector 102 to the circuit board 101. As illustrated in FIG. 6, while the connector 102 is being temporarily fixed on the circuit board 101 by the magnetic force of the magnet 602, the connector 102 is fixed to the circuit board 101 with the screw 104.

Figure 7:
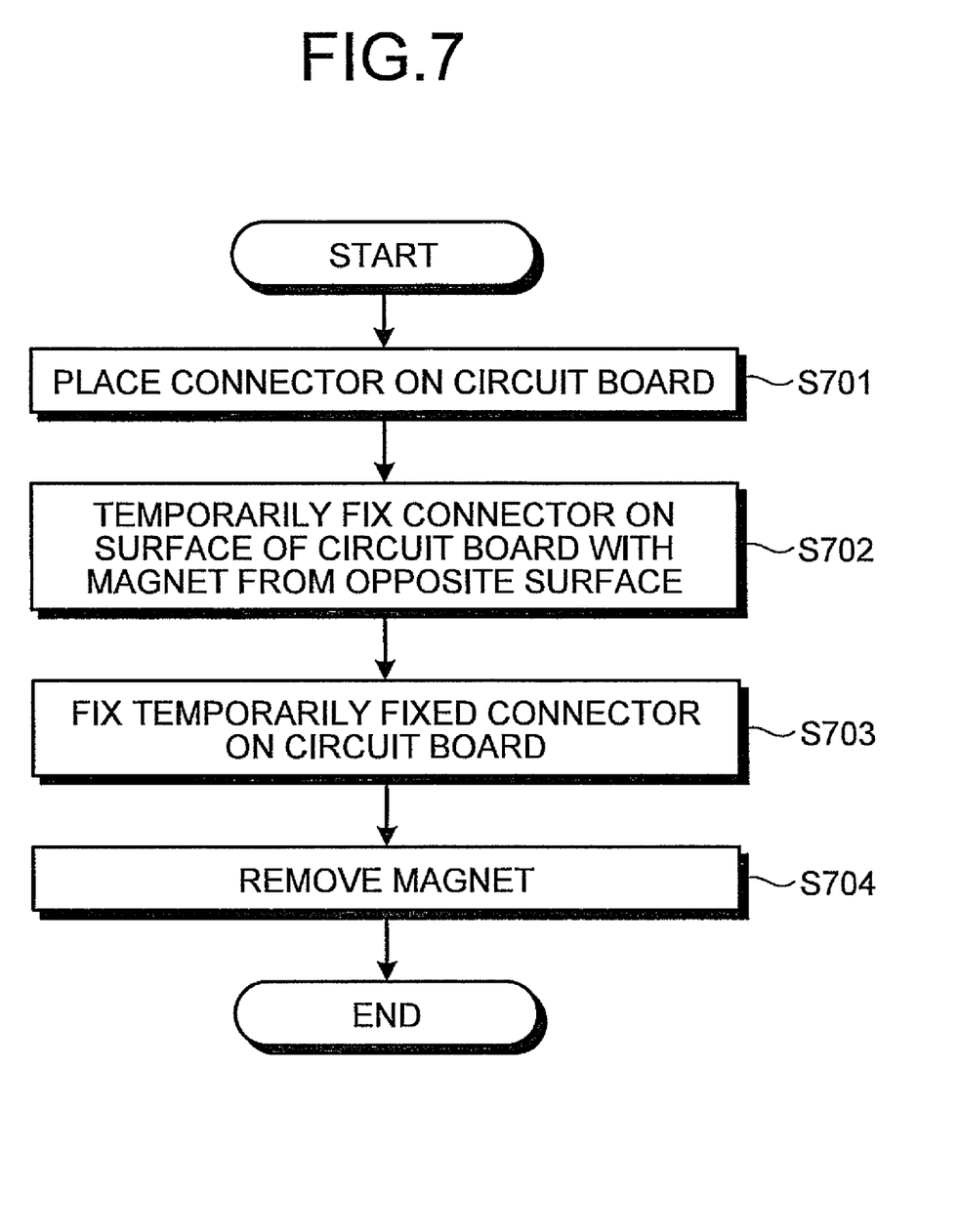
FIG. 7 is an exemplary flowchart of the process of fixing the connector to the circuit board in the process of manufacturing the electronic device in the embodiment.

A description will now be given of the process of fixing the connector 102 to the circuit board 101 in the process of manufacturing the electronic device 100. FIG. 7 is a flowchart of the process in the process of manufacturing the electronic device 100 performed by a manufacturing machine.

First, the manufacturing machine places electronic components including the connector 102 on the mounting surface of the circuit board 101 placed on the reflow palette 601 (S701).

The manufacturing machine then arranges the magnet 602 on the surface opposite the mounting surface of the circuit board 101. By attracting the nut 103 embedded in the connector 102 with the magnetic force of the magnet 602, the connector 102 is temporarily fixed on a position on the circuit board 101 previously provided for the connector 102 in the design such that the contact surface 203 of the connector 102 is in contact with the mounting surface (S702).

Thereafter, the manufacturing machine tightens the screw 104 into the nut 103 via the circuit board 101 while the connector 102 is being temporarily fixed on the circuit board 101, thereby fixing the connector 102 on the circuit board 101 (S703).

After that, the manufacturing machine removes the magnet 602 from the surface opposite the mounting surface of the circuit board 101 (S704). Thus, the connector 102 is fixed to the circuit board 101.

Figure 8A:
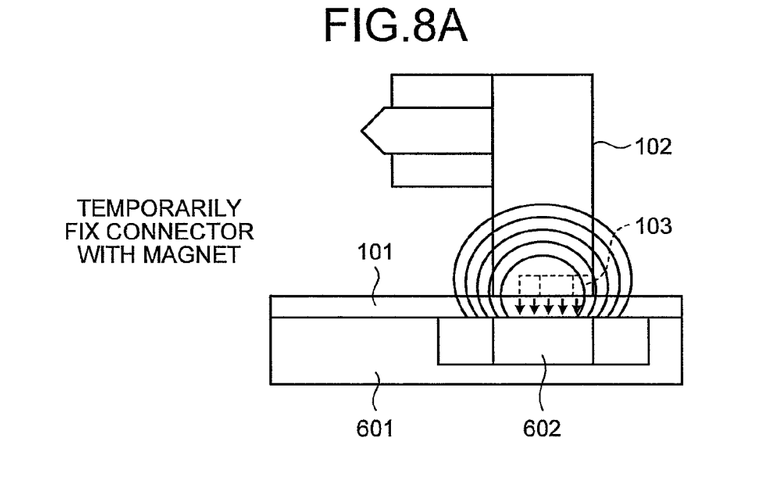
FIGS. 8A to 8C are exemplary schematic diagrams for explaining the sequence performed by a manufacturing machine to fix the connector to the circuit board in the embodiment.
Figure 8B:
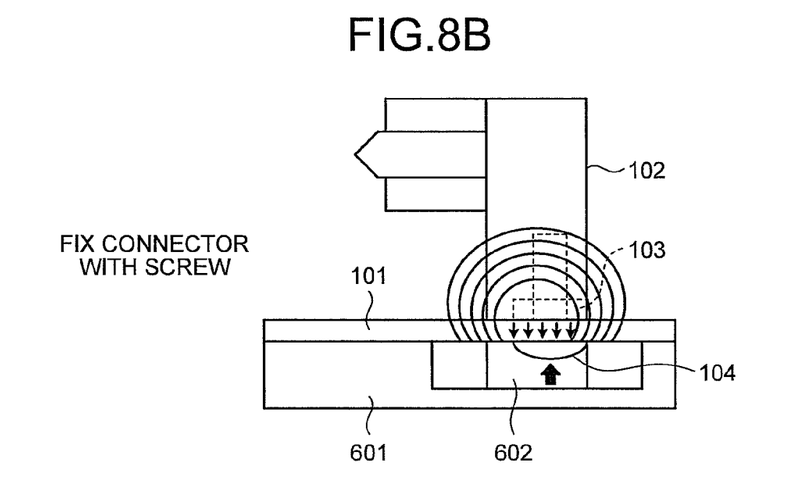
Figure 8C:
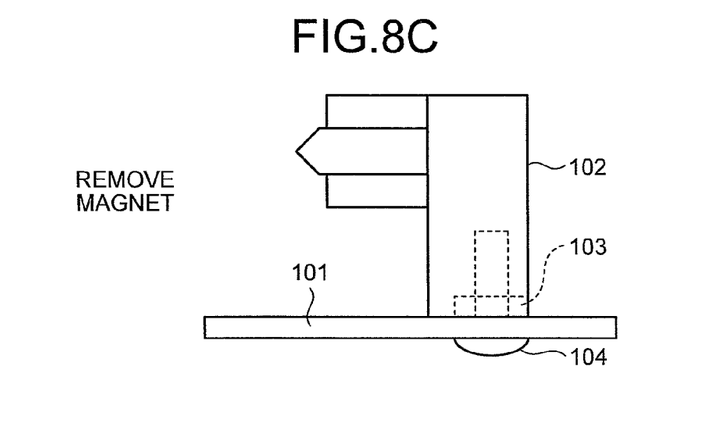

FIGS. 8A to 8C conceptually illustrate the process described above in connection with FIG. 7. As illustrated in FIG. 8A, the manufacturing machine temporarily fixes the connector 102 on the mounting surface of the circuit board 101 by attracting the nut 103 embedded in the connector 102 with the magnetic force of the magnet 602.

Next, as illustrated in FIG. 8B, the manufacturing machine tightens the screw 104 into the nut 103 while the connector 102 is being temporarily fixed on the circuit board 101, thereby fixing the connector 102 on the circuit board 101.

Then, as illustrated in FIG. 8C, the manufacturing machine removes the magnet 602. Thus, the process of fixing the connector 102 to the circuit board 101 is completed.

Figure 9:
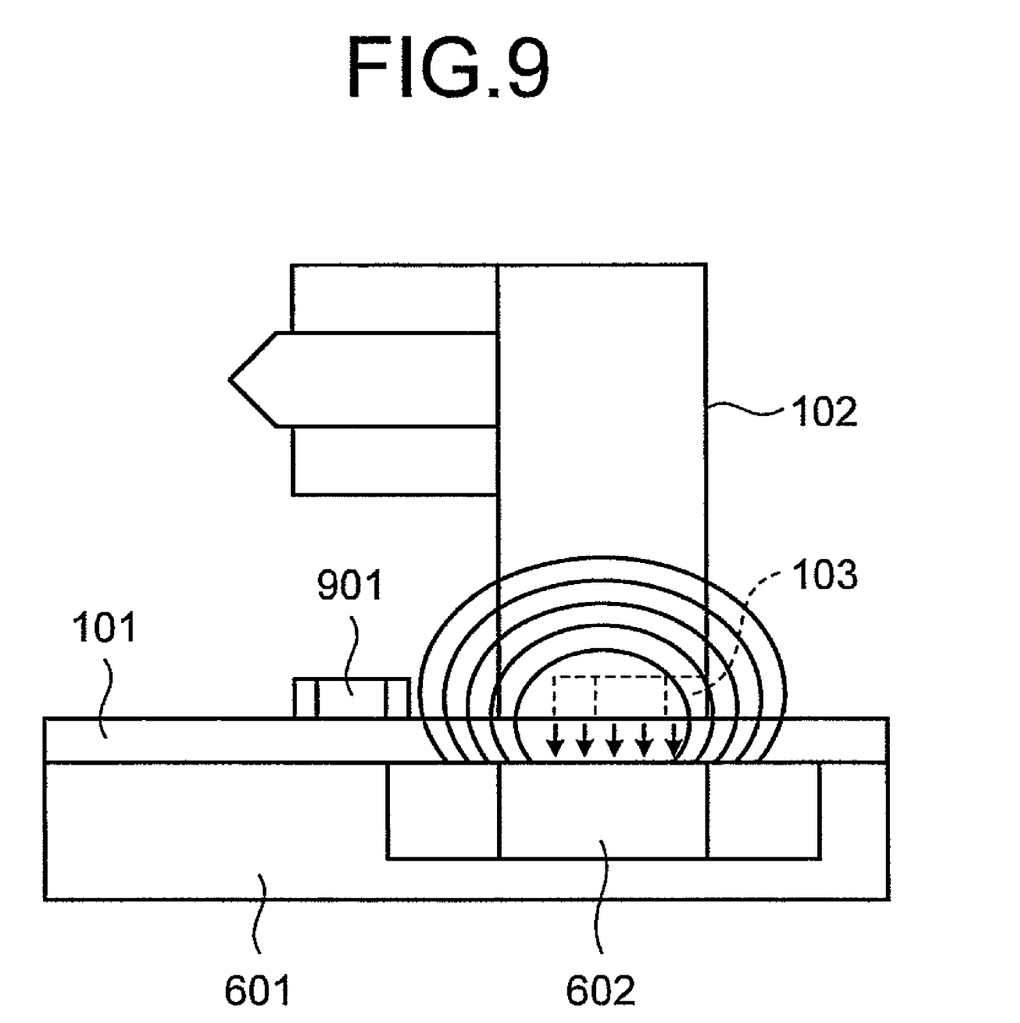
FIG. 9 is an exemplary schematic diagram of the electronic component arranged below the connector in the embodiment.

According to the embodiment, the connector 102 is fixed to the circuit board 101 in the manner as described above. Thus, the degree of freedom increases in the arrangement of electronic components on the circuit board 101. For example, as illustrated in FIG. 9, an electronic component 901 can be arranged in an area where it cannot be arranged with the conventional technology due to the inclination prevention cap 502. More specifically, the electronic component 901 can be arranged in an area below the cable connection mechanism 202 of the connector 501 and an area needing to be secured to remove the inclination prevention cap 502 with the conventional technology. The electronic component 901 may be fixed to the circuit board 101 by any methods including known ones such as reflow soldering.

Figure 10:
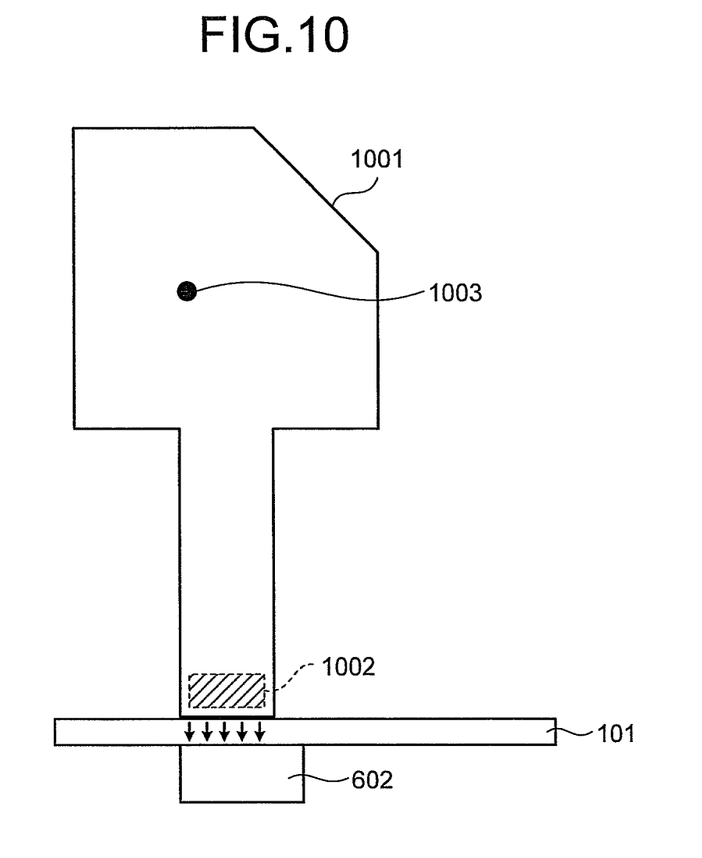
FIG. 10 is an exemplary schematic diagram of an electronic component that can be temporarily fixed to the circuit board by attracting a metal material with the magnet in the embodiment.

While, in the embodiment, the connector 102 is cited as an example of an electronic component temporarily fixed by the magnet 602, the electronic component is not limited to a connector. For example, an electronic component 1001 as illustrated in FIG. 10 may be temporarily fixed by the magnet 602. In the example of FIG. 10, the electronic component 1001 is difficult to place on the circuit board 101 because of a gravity center 1003 thereof. Therefore, the electronic component 1001 is temporarily fixed by attracting a metal material 1002 with the magnetic force of the magnet 602.

Figure 11:
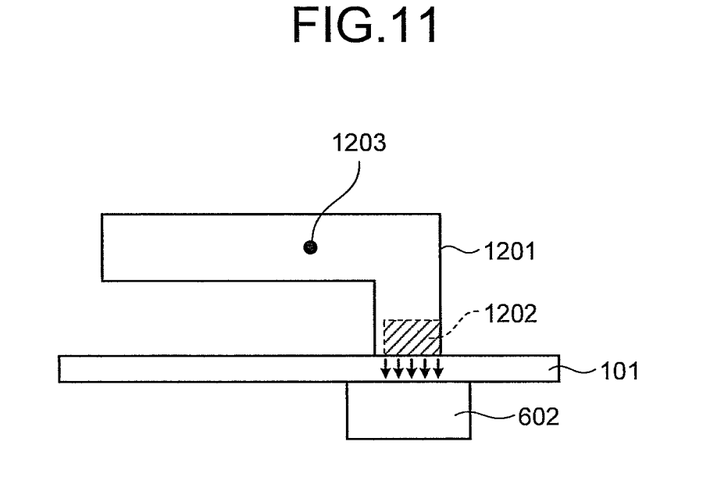
FIG. 11 is another exemplary schematic diagram of an electronic component that can be temporarily fixed to the circuit board by attracting a metal material with the magnet in the embodiment.

As another example, an electronic component 1201 as illustrated in FIG. 11 may be temporarily fixed by the magnet 602. The electronic component 1201 cannot be mounted on the circuit board 101 with the contact surface thereof being in contact with the circuit board 101 because of a gravity center 1203 thereof. Even in this case, the electronic component 1201 can be temporarily fixed with the contact surface thereof being in contact with the circuit board 101 by attracting a metal material 1202 with the magnetic force of the magnet 602. While temporarily fixed to the circuit board 101, the electronic component 1201 is fixed to the circuit board 101. The electronic component 1201 may be fixed to the circuit board 101 in various manners such as, for example, by a screw as described above, and by soldering.

As described above, according to the embodiment, when the circuit board 101 is mounted on the electronic device 100, the magnet 602 is arranged on the surface opposite the mounting surface of the circuit board 101. The magnet 602 attracts a metal material (the nut 103) of an electronic component (the connector 102). Thus, it is possible to prevent the inclination of an electronic component having difficulty to stand alone.

Moreover, it is not necessary to attach and detach a cap, a weight, or the like for preventing an electronic component from inclining, which reduces component cost and process steps. In addition, since it is not necessary to provide an auxiliary component such as a cap for preventing an electronic component from inclining or a jig hole, a (small) component can be placed below and near an electronic component having difficulty to stand alone.

Furthermore, while the connector 102 is being mounted on the circuit board 101, the metal material (the nut 103) of the connector 102 is attracted by the magnet 602 located on the surface opposite the mounting surface of the circuit board 101. Thus, it is possible to prevent the connector 102 from rising or lifting up from the circuit board 101.

That is, according to the embodiment, an electronic component is attracted and held by the magnetic force of a magnet. Therefore, there is no need for a hole to hold the electronic component, and thus a holding/fixing mechanism can be implemented within the size of components.

In recent years, with the downsizing of electronic devices, electronic components are becoming increasingly smaller and lighter. As electronic components becomes smaller and lighter, the mounting area thereof reduces and the increased number of electronic components have difficulty to standalone. Besides, there is a need for reducing an area used for a manufacturing jig. In view of this, according to the embodiment, it is possible to prevent an electronic component from inclining and rising or lifting up with the minimum necessary area for a manufacturing jig.

Further, according to the embodiment, it is possible to prevent an electronic component having difficulty to stand alone from inclining and rising or lifting up without limitation on the contact surface of the electronic component in terms of manufacturing a circuit board. Thus, more electronic components can be mounted on the mounting surface of the circuit board, which further increases mounting density.

Still further, a metal material such as a nut is embedded in an electronic component near the contact surface thereof so that the electronic component can be attracted by a magnet. With this, the connection between the electronic component and the magnet can be strengthened, and also the electronic component can be temporarily fixed more stably. In addition, the nut 103 is embedded in the connector 102 at a position on the opposite side of the center of gravity with respect to the center line of the contact surface. Accordingly, the magnet attracts the opposite side of the center of gravity, and thereby the connector 102 can be temporarily fixed more stably.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a circuit board with a first surface and a second surface opposite the first surface;
   an electronic component mounted on the first surface of the circuit board and comprising a metal nut; and
   a screw, wherein
   the electronic component further comprises a contact surface which is in contact with the first surface of the circuit board and comprises a center of gravity at a position deviated from a center of the contact surface,
   the nut is embedded in the electronic component at a position facing the contact surface of the electronic component,
   the electronic component is configured to be temporarily attached to the circuit board in a manner in which the first surface is in contact with the contact surface by a magnetic force attracting the nut from a side of the second surface, and
   the electronic component is configured to be fixed to the circuit board by tightening the screw into the nut while the electronic component is temporarily attached to the circuit board.

2. The electronic device of claim 1, wherein the electronic component comprises a cable socket substantially in parallel to the contact surface.

3. The electronic device of claim 2, wherein the nut is configured to be embedded in the electronic component at a position opposite to the cable socket with respect to the center of the contact surface.

4. An electronic component comprising:
   a contact surface which is in contact with a first surface of a circuit board; and
   a metal nut, wherein
   a center of gravity of the electronic component is being at a position deviated from a center of the contact surface, and
   the nut is embedded in the electronic component at a position where the electronic component is temporarily attached to the circuit board, the electronic component being temporarily attached in a manner in which the first surface is in contact with the contact surface by a magnetic force attractin the nut from a side of a second surface of the circuit board which is opposite the first surface of the circuit board.

5. The electronic component of claim 4, further comprising a cable socket substantially in parallel to the contact surface.

6. A method of manufacturing an electronic device in which an electronic component is attached to a first surface of a circuit board, the method comprising:
   placing the electronic component on the first surface, wherein a metal nut is embedded in the electronic component at a position facing a contact surface of the electronic component with respect to the circuit board, and a center of gravity of the electronic component is at a position deviated from a center of the contact surface;
   temporarily attaching the electronic component to the circuit board in a manner in which the first surface is in contact with the contact surface by a magnetic force attracting the nut from a side of a second surface of the circuit board opposite the first surface; and
   fixing the electronic component onto the circuit board with a screw which is tightened into the nut while the electronic component is temporarily attached to the circuit board.

* * * * *